(12) United States Patent
Fried et al.

(10) Patent No.: US 6,662,350 B2
(45) Date of Patent: Dec. 9, 2003

(54) FINFET LAYOUT GENERATION

(75) Inventors: David M. Fried, Williston, VT (US); William C. Leipold, Enosburg Falls, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/683,631

(22) Filed: Jan. 28, 2002

(65) Prior Publication Data

US 2003/0145299 A1 Jul. 31, 2003

(51) Int. Cl.$^7$ .............................................. G06F 17/50
(52) U.S. Cl. .................. 716/11; 716/8; 716/1
(58) Field of Search .................... 716/11, 8, 1

(56) References Cited

U.S. PATENT DOCUMENTS 5,097,422 A * 3/1992 Corbin et al. .................. 716/8
6,413,802 B1 * 7/2002 Hu et al. .................... 438/151

OTHER PUBLICATIONS

Tang et al. "FinFET—A Quasi–Planar Double–gate MOSFET", IEEE, 2001.*

* cited by examiner

Primary Examiner—Leigh M. Garbowski
Assistant Examiner—Brandon Bowers
(74) Attorney, Agent, or Firm—John W. LaBatt; Hoffman, Warnick & D'Alessandro (57) ABSTRACT

A method and system for generating a set of FinFET shapes. The method and system locate a gate in an FET layout. The set of FinFET shapes is generated coincident with the gate. The method and system can further create a FinFET layout by modifying the FET layout to include the set of FinFET shapes.

19 Claims, 9 Drawing Sheets

FINFET LAYOUT GENERATION

BACKGROUND OF THE INVENTION

1. Technical Field

The invention generally relates to field effect transistor (FET) and three-dimensional FET (FinFET) layouts. Specifically, the invention generates a set of FinFET shapes by analyzing an FET layout. Further, a FinFET layout can be created by modifying the FET layout to include the set of FinFET shapes. The FinFET layout can be further modified to comply with electrical and/or design constraints.

2. Related Art

In the generation of layouts for electronic devices, an FET can typically be defined by a silicon active area that-intersects with one or more polysilicon lines. The silicon active area is often a two-dimensional, planar layer of silicon. Recent advances allow the planar layer to be replaced by a three-dimensional layer of silicon to create what is commonly referred to as a FinFET.

A FinFET is a double gate FET with a fully depleted body that provides several advantages over a conventional FET. These advantages include nearly ideal turn off in sub-threshold voltages, giving lower off-currents and/or allowing lower threshold voltages, no loss to drain currents from body effects, no 'floating' body effects (often associated with some Silicon on Insulator (SOI) FETs), higher current density, lower voltage operation, and reduced short channel degradation of threshold voltage and off current. Furthermore, FinFETs are more easily scaled to smaller physical dimensions and lower operating voltages than conventional and SOI FETs.

Frequently, an FET layout is created-by incorporating shapes that represent the desired shape of silicon active areas and polysilicon lines. Once created, the FET layout is used to generate an active area mask. Using the active area mask, the correct active area can then be applied. Several constraints limit the application process. For example, an active area must have a minimal width and a minimal amount of space must be left between active areas.

Numerous software products exist that allow for the relatively easy design of an FET layout including, for example, IBM's Niagara, Avant!Â®, Metrographics and CadenceÂ®. However, no solutions currently exist for generating a FinFET layout.

SUMMARY OF THE INVENTION

As a result, there exists a need to generate a set of FinFET shapes based on an FET layout. Further, a need exists to create a FinFET layout by modifying an FET layout to include a set of FinFET shapes. Further, a need exists to ensure that a FinFET layout conforms with electrical and/or design constraints.

The invention generates a set of FinFET shapes using an FET layout. The invention can further create a FinFET layout by modifying the FET layout to include the set of FinFET shapes. The invention can also modify an active area in a FinFET layout to conform with electrical and/or design constraints.

A first aspect of the invention provides a method for generating a set of FinFET shapes, comprising: locating a gate in an FET layout; finding a gate axis of the gate; generating the set of FinFET shapes coincident with the gate; and stretching the set of FinFET shapes perpendicular to the gate axis.

A second aspect of the invention provides a computer program product comprising a computer useable medium having computer readable program code embodied therein for generating a set of FinFET shapes, the program product comprising: program code for locating a gate in an FET layout; program code for finding a gate axis of the gate; program code for-generating the set of FinFET shapes coincident with the gate; and program code for stretching the set of FinFET shapes perpendicular to the gate axis.

A third aspect of the invention provides a system for generating a set of FinFET shapes, comprising: a location system for locating a gate in an FET layout; and a generation system for generating a set of FinFET shapes coincident with the gate.

The exemplary aspects of the present invention are designed to solve the problems herein described and other problems not discussed, which are discoverable by a skilled artisan.

BRIEF DESCRIPTION OF THE DRAWINGS

These and other features and advantages of this invention will be more readily understood from the following detailed description of the various aspects of the invention taken in conjunction with the accompanying drawings in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

The invention provides a method for generating a set of FinFET shapes that partially define a FinFET. The method analyzes an FET layout (data that defines a layout for an electronic device including at least one FET) to generate the set of FinFET shapes by locating a gate in the FET layout and generating the set of FinFET shapes coincident with the gate. The invention further provides a method and system for creating a FinFET layout (data that defines a layout for an electronic device including at least one FinFET) from an FET layout by modifying the FET layout to include the set of FinFET shapes.

Figure 1:
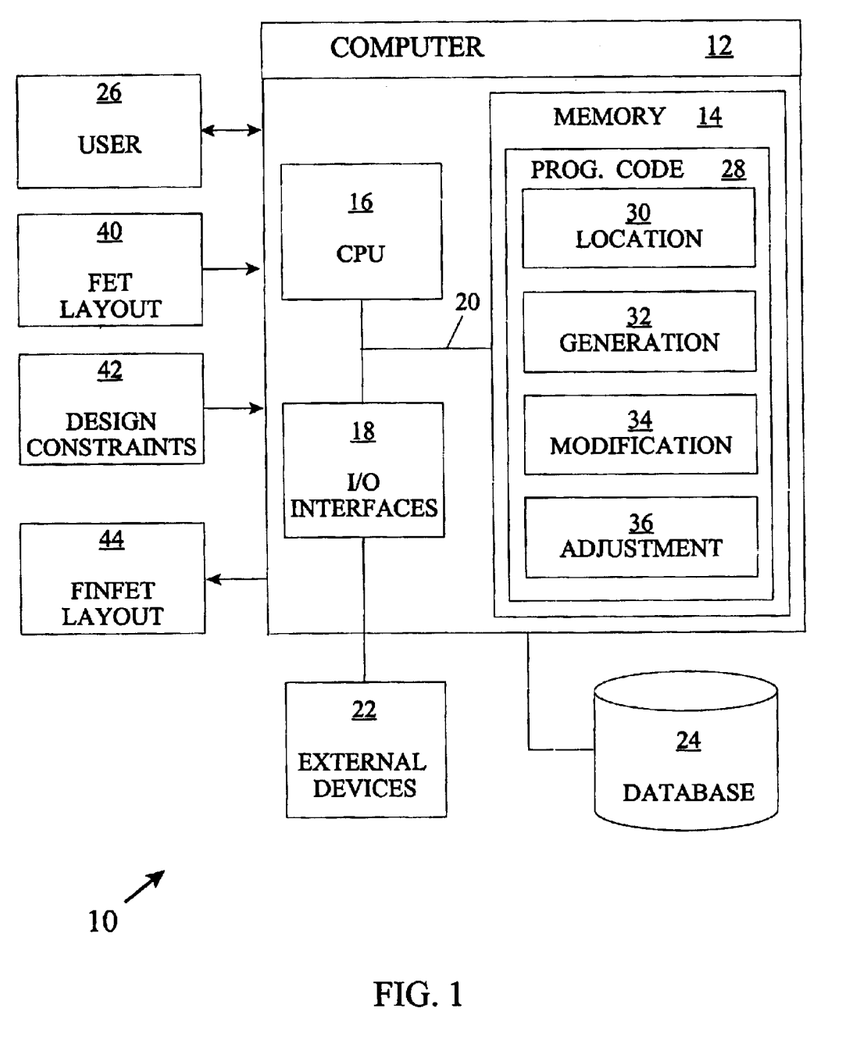
FIG. 1 depicts a system according to one aspect of the invention.

Turning to FIG. 1, a FinFET layout generation system 10 according to one aspect of the invention is depicted. FinFET layout generation system 10 generally comprises computer 12 and program code 28. User 26 can interact with computer 12 and program code 28 to generate a FinFET layout 44.

Computer 12 generally comprises memory 14, central processing unit (CPU) 16, input/output (I/O) interfaces 18 and bus 20. A database 24 may also be provided for storage of data relative to processing tasks. Memory 14 (and database 24) may comprise any known type of data storage and/or transmission media, including magnetic media, optical media, random access memory (RAM), read-only memory (ROM), a data cache, a data object, etc. Moreover, memory 14 (and database 24) may reside at a single physical location, comprising one or more types of data storage, or be distributed across a plurality of physical systems in various forms. CPU 16 may comprise a single processing unit, or be distributed across one or more processing units in one or more locations, e.g., on a client and server. A server computer typically comprises an advanced mid-range multiprocessor-based server, such as the RS6000 from IBM, utilizing standard operating system software, which is designed to drive the operation of the particular hardware and which is compatible with other system components and I/O controllers. I/O interfaces 18 may comprise any system for exchanging information with one or more external devices 22. For example, external devices 22 may comprise any known type of input/output device including any number of a network system, modem, keyboard, mouse, scanner, voice recognition system, cathode-ray tube (CRT), liquid-crystal display (LCD), printer, disc drives, etc. Bus 20 provides a communication link between each of the components in computer 12 and likewise may comprise any known type of transmission link, including electrical, optical, wireless, etc. In addition, although not shown, additional components, such as cache memory, communication systems, system software, etc., may be incorporated into computer 12.

Figure 2:
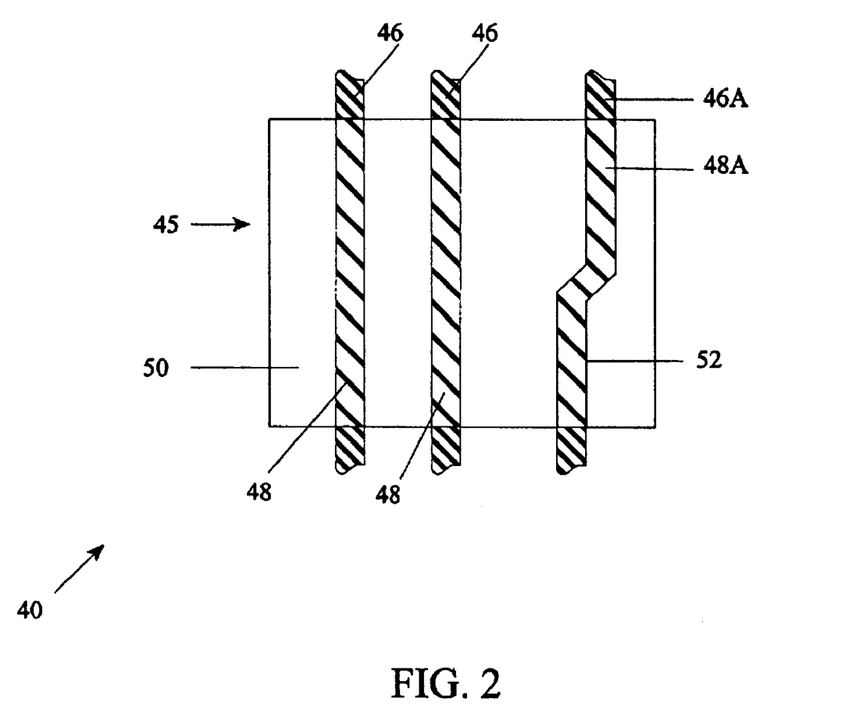
FIG. 2 depicts a portion of an exemplary FET layout.

In one embodiment, FinFET layout generation system 10 receives an FET layout 40 and design constraints 42. FIG. 2 depicts a portion of an exemplary FET layout 40. FET layout 40 includes data that defines at least one FET 45 and one or more polysilicon lines 46. For example, FET 45 can include one or more gates 48 and an active area 50. Gates 48 can be identified as an intersection of active area 50 and polysilicon lines 46. When in operation, active area 50 can act as a source or drain for current passing through polysilicon lines 46.

As seen in FIG. 1, program code 28 is shown including location system 30. Using FIG. 2 as an example, location system 30 locates gates 48 in FET layout 40. Gates 48 can be found by first determining an active area 50 and polysilicon lines 46 in FET layout 40. Gates 48 can then be identified as an intersection of active area 50 and polysilicon lines 46. Location system 30 can also find a gate axis 52. For example, gate axis 52 can be a long edge of a particular gate 48. Gate axis 52 can be used by generation system 32 when generating the set of FinFET shapes as discussed in further detail below.

Figure 3:
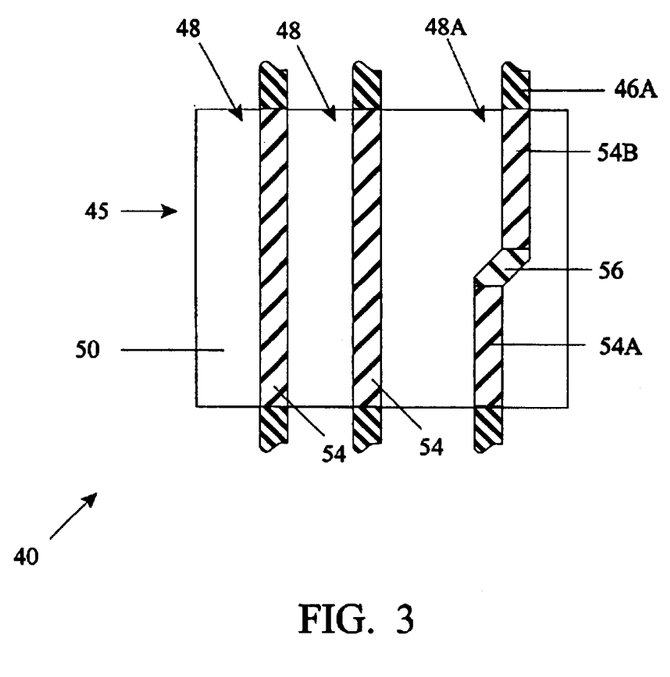
FIG. 3 depicts an exemplary step for generating a set of FinFET shapes according to one aspect of the invention.
Figure 4:
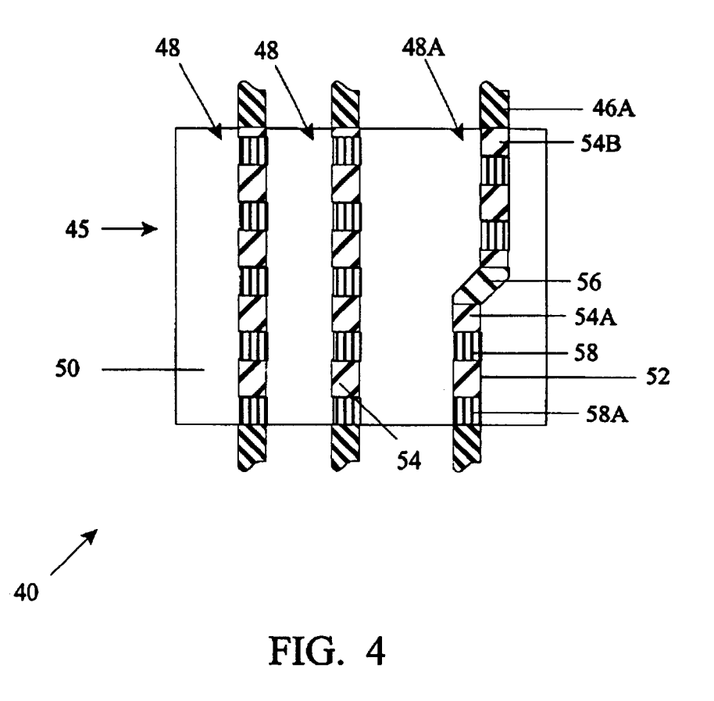
FIG. 4 depicts an exemplary step for generating a set of FinFET shapes according to one aspect of the invention.
Figure 5:
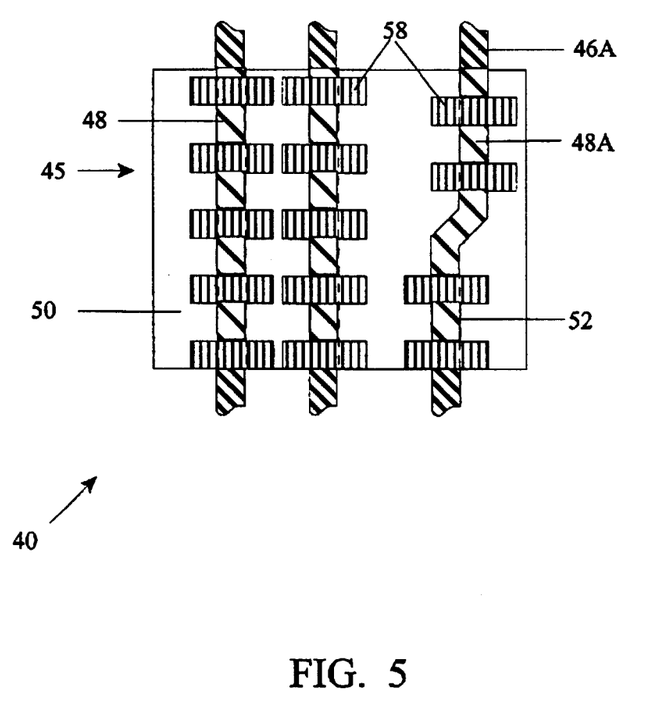
FIG. 5 depicts an exemplary step for generating a set of FinFET shapes according to one aspect of the invention.

FIG. 1 also shows program code 28 including generation system 32 for generating a set of FinFET shapes coincident with gate(s) 48. FIGS. 3–5 depict exemplary steps of generating the set of FinFET shapes according to one aspect of the invention. As shown in FIG. 3, FET layout 40 includes gates 48. The exemplary implementation of the invention limits the placement of FinFET shapes to rectangular region(s) 54 of gate(s) 48. Consequently, after locating each gate 48, rectangular regions 54 within each gate 48 are identified. For example, gate 48A includes two rectangular regions 54A, 54B connected by angled region 56.

FIG. 4 depicts a next step in this exemplary implementation. Continuing with gate 48A as an example of the general method, FinFET shape 58A can be placed on gate 48A. The size and/or location of each FinFET shape 58 can be determined by one or more design constraint(s) 42 (FIG. 1) and/or the size of a corresponding polysilicon line 46 and active area 50. As discussed above, each FinFET shape 58 can be placed on rectangular region 54. Alternatively, FinFET shapes 58 can be placed anywhere on gate 48, including, for example, angled region 56. After placing an initial FinFET shape 58 on gate 48, each additional FinFET shape 58 can be similarly placed on gate 48 (rectangular region 54) at least a predetermined distance from every other FinFET shape 58 on gate 48 (rectangular region 54). Continuing to use gate 48A as an example, initially, FinFET shape 58A can be placed at a location on rectangular region 54A. Gate axis 52 of gate 48A can be used to determine the location of subsequent FinFET shapes 58, for example, by providing a direction to move from FinFET shape 58A and defining a total distance within which FinFET shapes 58 will be placed. A set of FinFET shapes 58 for gate 48A is complete when no additional FinFET shape 58 can be placed on gate 48A (rectangular regions 54A, 54B) at least a predetermined distance from every other FinFET shape 58 on gate 48A (rectangular regions 54A, 54B). The method is repeated for each gate 48 and/or each rectangular region 54 in FET layout 40.

Once each set of FinFET shapes 58 is generated coincident with each gate 48, each set of FinFET shapes 58 can be stretched perpendicular to a corresponding gate axis 52. FIG. 5 depicts sets of FinFET shapes 58 after being stretched perpendicular to gate axes 52. In this example, each FinFET shape 58 was stretched outward from gate axes 52 (long edges) on both sides of corresponding gate 48. The amount that each FinFET shape 58 is stretched can be determined by one or more design constraint(s) 42 (FIG. 1), active area 50 and/or polysilicon line 46.

FIG. 5 depicts the final set of FinFET shapes 58 located so that corresponding gates 48 pass substantially near the center of each FinFET shape 58. Alternatively, gates 48 can pass substantially closer to one end of each FinFET shape 58. Additionally, while FinFET shapes 58 are described as being placed and stretched, it is understood that FinFET shapes 58 of a desired size can be appropriately located without requiring the stretching step. Further, while the method describes locating each gate 48, placing each FinFET shape 58 and stretching each FinFET shape 58, it is understood that each of the steps can be fully performed for one or more FinFET shapes 58, for example, without having found all gates 48.

Figure 6:
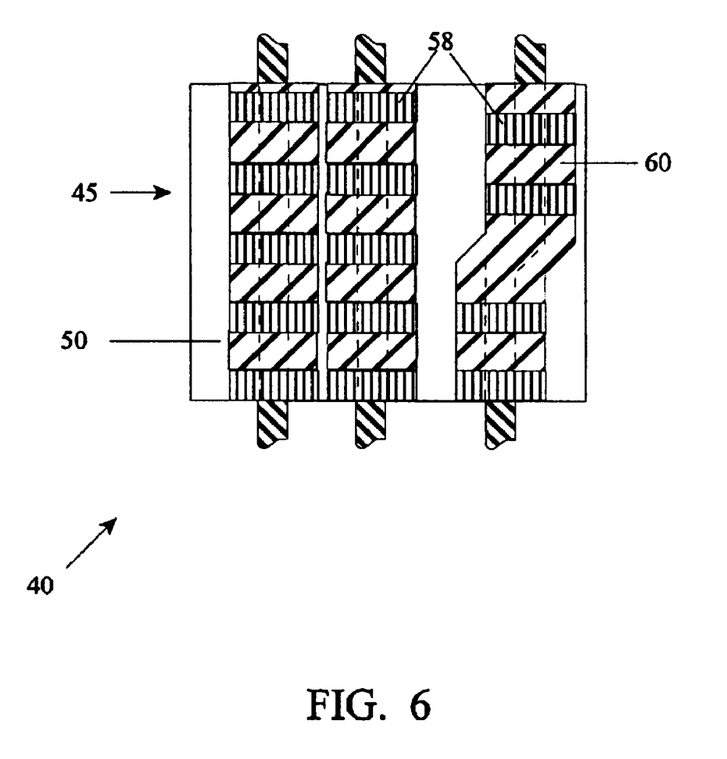
FIG. 6 depicts an exemplary step for generating a FinFET layout according to one aspect of the invention.
Figure 7:
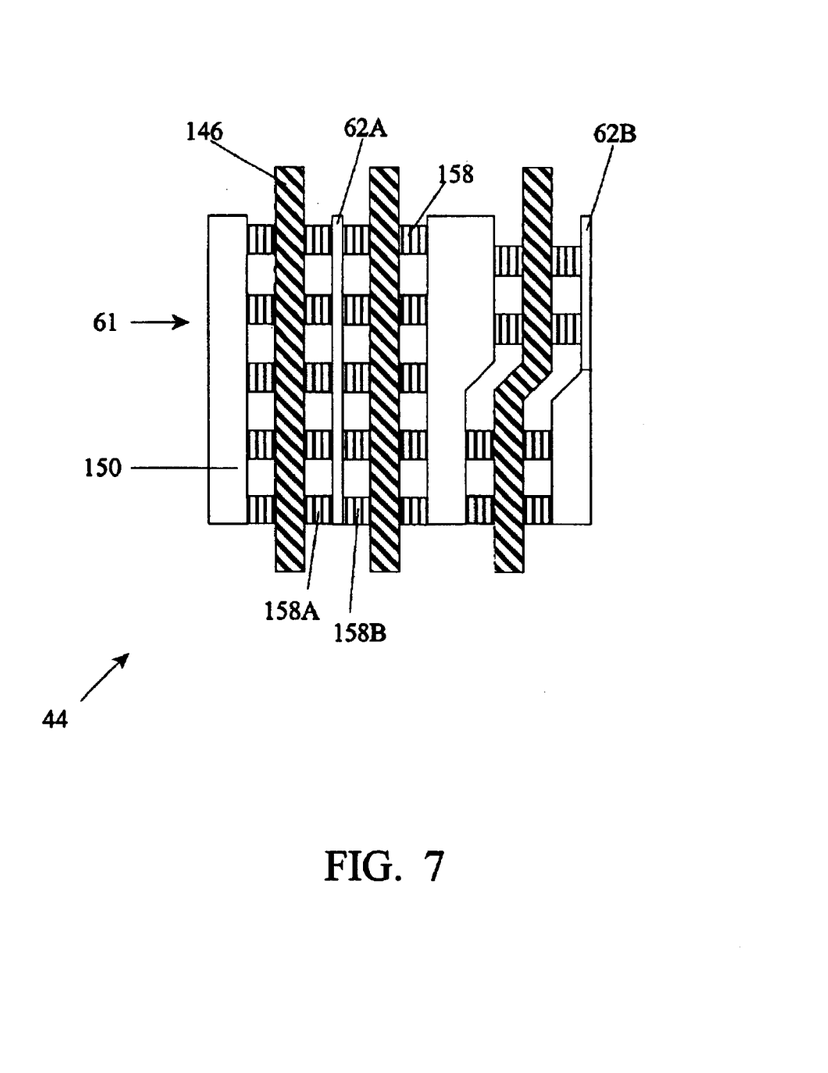
FIG. 7 depicts a portion of a FinFET layout as it is created from an FET layout according to one aspect of the invention.
Figure 8:
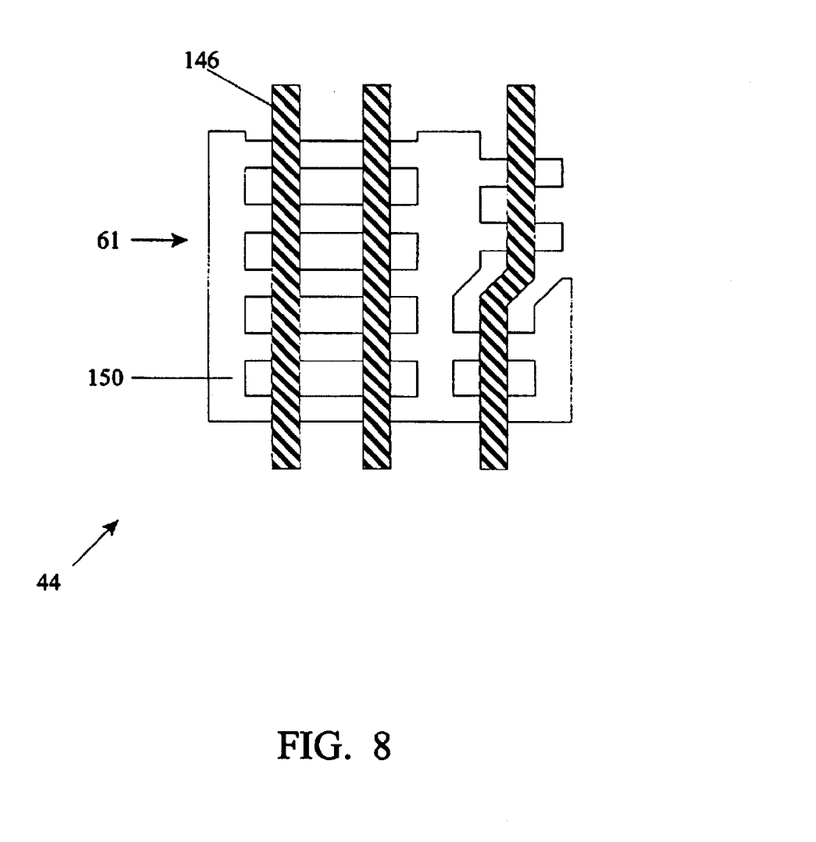
FIG. 8 depicts a portion of an exemplary FinFET layout according to one aspect of the invention.

As shown in FIG. 1, the invention can further include modification system 34. Modification system 34 can create a FinFET layout by modifying the FET layout to include the set of FinFET shapes. FIGS. 6-8 depict exemplary steps for generating a FinFET layout according to one aspect of the invention.

As shown in FIG. 6, for example, a removal area 60 can be defined in FET layout 40. Removal area 60 represents a portion of active area 50 to be replaced by set(s) of FinFET shapes 58. For example, removal area 60 can initially be defined as a portion of active area 50 that corresponds to a particular gate 48 (FIG. 2). Removal area 60 can be stretched perpendicular to gate axis 52 (FIG. 2) in a substantially similar fashion as described above with reference to FinFET shapes. Alternatively, as also described above, removal area 60 can be initially defined as the desired area, without requiring the stretching step.

FIG. 7 depicts a portion of a FinFET layout 44 as it is created from FET layout 40 (FIG. 6). FinFET layout 44 is shown having a FinFET device 61, including an active area 150, sets of FinFET shapes 158, 158A, 158B and polysilicon lines 146. Active area 150 is created from active area 50 of FIG. 6 by removing each removal area 60. Set(s) of FinFET shapes 158, 158A, 158B are then added to active area 150. As a result, active area 150 includes area(s) defined by the set(s) of FinFET shapes 158, 158A, 158B.

However, active area 150 may require adjusting to conform with a set of design constraints 42 (FIG. 1). Design constraint(s) 42 can include, for example, a minimum width and a minimum spacing. These values can be determined by electrical and/or lithographic constraints of the manufacturing process. As a result of the previous steps, active area 150 may have a portion that is narrower than a minimum width. Similarly, a gap may be present within active area 150 that is narrower than the minimum spacing.

As shown in FIG. 1, program code 28 can further include adjustment system 36 for adjusting an active area in a FinFET layout to conform with a set of design constraints 42. Returning to FIG. 7, assume, for example, that design constraints 42 includes a minimum width and minimum spacing and that these constraints are substantially the same distance. Additionally, assume portions 62A, 62B of active area 150 are narrower than the minimum width Adjustment system 36 removes portions 62A, 62B of active area 150. However, for example, once portion 62A is removed, a gap between FinFET shapes 158A, 158B (now part of active area 150) is created. Consequently, adjustment system 36 adds an area to active area 150 to fill the gap. FIG. 8 depicts a portion of an exemplary FinFET layout 44 after each step has been performed. Active area 150 is shown with portions 62A, 62B (FIG. 7) removed, and additional areas added to fill the resulting gaps.

Figure 9:
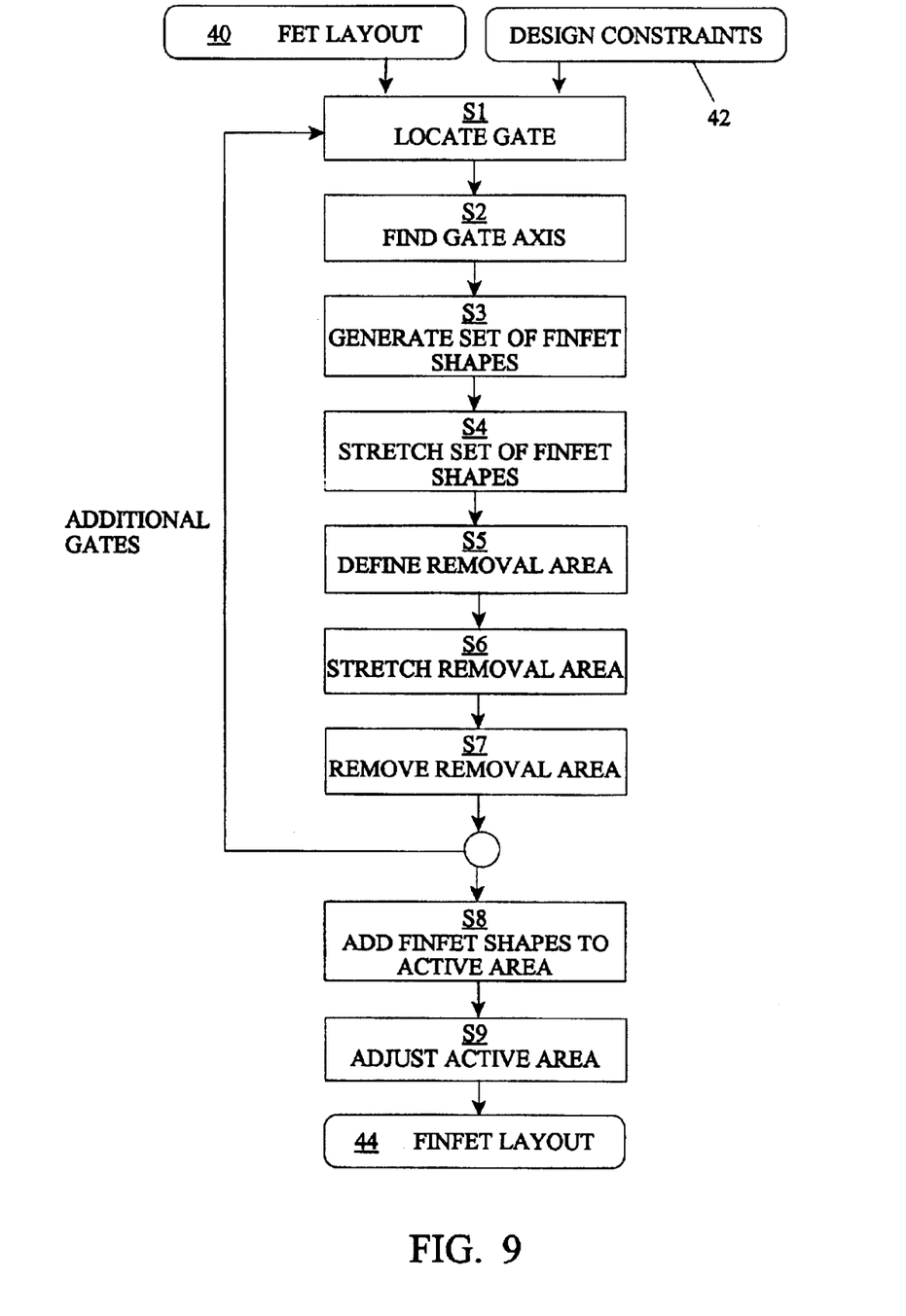
FIG. 9 depicts a FinFET layout generation method according to one aspect of the invention.

FIG. 9 depicts a FinFET layout generation method according to one aspect of the invention. Initially, a gate is located in FET layout 40 in step S1. The gate may be defined by an intersection of a polysilicon line with an active area as described above. Once located, a gate axis for the gate is determined in step S2. A set of FinFET shapes can then be generated in step S3 that are coincident with the gate, and in step S4, each of the FinFET shapes is stretched by a predetermined amount in a direction perpendicular to the gate axis. The generation of the FinFET shapes can be partially determined by one or more of design constraints 42.

In step S5, a removal area of the active area is defined. Initially, this can be defined as a portion of the active area that corresponds to the gate. The removal area is stretched in step S6 in a manner similar to the FinFET shapes. The removal area is then removed from the active area in step S7.

The initial steps can be repeated for one or more gates in the FET layout. Once FinFET shapes have been generated for every desired gate, the FinFET shapes can be added to the active area in step S8. Finally, step S9 adjusts the active area to conform with the set of design-constraints 42. This results in a completed FinFET layout 44.

It is understood that the method depicted in FIG. 9 is only exemplary of the methods of the invention. Each step is shown in a linear fashion for clarity. Steps may be performed in parallel (for example, steps S1 and S5), and/or the order of the steps can be modified. Additionally, steps can be merged and/or dropped. For example, steps S1 and S5 can be merged, while step S4 can be dropped if the initial set of FinFET shapes is the desired size.

In the previous discussion, it will be understood that the method steps discussed can be performed by a processor, such as CPU 16 of computer 12, executing instructions of a program product (such as program product 28) stored in memory 14. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which, when loaded in a computer system, is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method for generating a set of FinFET shapes, comprising:
   locating a gate in an FET layout;
   finding a gate axis-of the gate;
   generating the set of FinFET shapes coincident with the gate; and
   stretching the set of FinFET shapes perpendicular to the gate axis.

2. The method of claim 1, wherein the locating step includes:
   determining an active area in the FET layout;
   determining a polysilicon line in the FET layout; and
   identifying the gate as an intersection of the active area and the polysilicon line.

3. The method of claim 2, further comprising:
   defining a removal area as a portion of the active area that corresponds to the gate;
   stretching the removal area perpendicular to the gate axis; and
   removing the removal area from the active area.

4. The method of claim 3, further comprising:
   adding the set of FinFET shapes to the active area; and
   adjusting the active area to conform with a set of design constraints.

5. The method of claim 4, wherein the set of design constraints includes a minimum width and a minimum spacing, and wherein the adjusting step includes:
   removing a portion of the active area that is narrower than the minimum width; and adding an area to the active area to fill a gap in the active area, the gap being narrower than the minimum spacing.

6. The method of claim 1, wherein the generating step includes:

placing one of the set of FinFET shapes on the gate; and placing each additional FinFET shape on the gate and at least a predetermined distance from every other FinFET shape.

7. The method of claim 6, wherein the generating step further includes identifying a rectangular region within the gate, and wherein each FinFET shape is placed on the rectangular region.

8. A computer program product comprising a computer useable medium having computer readable program code embodied therein for generating a set of FinFET shapes, the program product comprising:

program code for locating a gate in an FET layout;

program code for finding a gate axis of the gate;

program code for generating the set of FinFET shapes coincident with the gate; and program code for stretching the set of FinFET shapes perpendicular to the gate axis.

9. The computer program product of claim 8, wherein the program code configured to locate the gate includes:

program code for determining an active area in the FET layout;

program code for determining a polysilicon line in the FET layout; and program code for identifying the gate as an intersection of the active area and the polysilicon line.

10. The computer program product of claim 9, further comprising:

program code for defining a removal area as a portion of the active area that corresponds to the gate;

program code for stretching the removal area perpendicular to the gate axis; and program code for removing the removal area from the active area.

11. The computer program product of claim 10, further comprising:

program code for adding the set of FinFET shapes to the active area; and program code for adjusting the active area to conform with a set of design constraints.

12. The computer program product of claim 11, wherein the set of design constraints includes a minimum width, and wherein the program product further comprises program code for removing a portion of the active area that is narrower than the minimum width.

13. The computer program product of claim 11, wherein the set of design constraints includes a minimum spacing, and wherein the program product further comprises program code for adding an area to the active area to fill a gap in the active area, the gap being narrower than the minimum spacing.

14. The computer program product of claim 8, further comprising:

program code for placing one of the set of FinFET shapes on the gate; and program code for placing each additional FinFET shape on the gate and at least a predetermined distance from every other FinFET shape on the gate.

15. The computer program product of claim 14, further comprising program code for identifying a rectangular region within the gate, wherein each FinFET shape is placed on the rectangular region.

16. A system for generating a set of FinFET shapes, comprising:

a location system for locating a gate in a FET layout;

a generation system for generating a set of FinFET shapes coincident with the gate; and a modification system for creating a FinFET layout by modifying the FET layout to include the set of FinFET shapes.

17. The system of claim 16, further comprising:

an adjustment system for adjusting an active area in the FinFET layout to conform with a set of design constraints.

18. The system of claim 17, wherein the set of design constraints includes a minimum width, and wherein a portion of the active area that is narrower than the minimum width is removed.

19. The system of claim 17, wherein the set of design constraints includes a minimum spacing, and wherein an area is added to the active area to fill a gap in the active area, the gap being narrower than the minimum spacing.

* * * * *